United States Patent
Luo et al.

(10) Patent No.: US 11,018,654 B1
(45) Date of Patent: May 25, 2021

(54) TEMPERATURE SENSOR WITH REDUCED POWER SUPPLY VOLTAGE SENSITIVITY

(71) Applicant: Marvell Asia Pte, Ltd., Singapore (SG)

(72) Inventors: Lei Luo, Shanghai (CN); Song Chen, Shanghai (CN); Jiancheng Zhang, Shaoxing (CN); Minchao Zhou, Shanghai (CN)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/946,233

(22) Filed: Jun. 11, 2020

Related U.S. Application Data

(60) Provisional application No. 62/860,192, filed on Jun. 11, 2019.

(51) Int. Cl.
*G01K 7/00* (2006.01)
*H03K 3/011* (2006.01)
*H03K 3/03* (2006.01)
*G01K 7/32* (2006.01)

(52) U.S. Cl.
CPC .............. *H03K 3/0315* (2013.01); *G01K 7/00* (2013.01); *G01K 7/32* (2013.01); *H03K 3/011* (2013.01)

(58) Field of Classification Search
CPC .......... G01K 7/00; G01K 7/203; G01K 7/245; G01K 7/32; H03K 3/011; H03K 3/0315; H03K 3/0322
See application file for complete search history.

(56) References Cited

U.S. PATENT DOCUMENTS

| | | | |
|---|---|---|---|
| 7,200,504 B1* | 4/2007 | Fister ............... | G01K 1/024 374/E1.004 |
| 7,831,873 B1* | 11/2010 | Trimberger ........ | G01K 7/32 714/725 |
| 10,247,621 B1* | 4/2019 | Partridge ........... | H03L 7/0991 |
| 2002/0181543 A1* | 12/2002 | Yin .................. | G01K 7/203 374/170 |
| 2012/0170616 A1* | 7/2012 | Tsai ................. | G01K 7/01 374/163 |
| 2015/0300889 A1* | 10/2015 | Ramaraju .......... | G01K 7/01 374/170 |
| 2017/0038264 A1* | 2/2017 | Odedara ............ | G01K 7/32 |
| 2019/0025135 A1* | 1/2019 | Zhang .............. | G01K 7/32 |
| 2019/0131928 A1* | 5/2019 | Rachala ............ | G01K 7/01 |
| 2019/0199329 A1* | 6/2019 | Shor ................. | H03K 3/0315 |
| 2020/0182707 A1* | 6/2020 | Badets .............. | G01K 7/32 |
| 2020/0209070 A1* | 7/2020 | Tang ................ | G01K 7/32 |
| 2020/0333393 A1* | 10/2020 | Fayneh ............. | G01R 31/2884 |

* cited by examiner

*Primary Examiner* — Levi Gannon

(57) ABSTRACT

Circuitry for determining temperature of an integrated circuit device includes, on the device, a ring oscillator and a bias current generator. The bias current generator is selectably operable in (i) a first mode having a first sensitivity to device temperature or (ii) a second mode having a second sensitivity to device temperature, to provide bias current for the ring oscillator. A controller operates the bias current generator in the first mode and records a frequency output of the ring oscillator, then operates the bias current generator in the second mode and records a frequency output of the ring oscillator, and determines the temperature of the integrated circuit device from a ratio of (a) the frequency output of the ring oscillator while the bias current generator operates in the first mode to (b) the frequency output of the ring oscillator while the bias current generator operates in the second mode.

18 Claims, 2 Drawing Sheets

TEMPERATURE SENSOR WITH REDUCED POWER SUPPLY VOLTAGE SENSITIVITY

CROSS REFERENCE TO RELATED APPLICATION

This disclosure claims the benefit of commonly-assigned U.S. Provisional Patent Application No. 62/860,192, filed Jun. 11, 2019, which is hereby incorporated by reference herein in its entirety.

FIELD OF USE

This disclosure relates to solid-state temperature sensors. More particularly, this disclosure relates to a ring-oscillator-based temperature sensor having reduced sensitivity to voltage supply variations.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Temperature sensors may be included in many types of integrated circuit devices, such as processors. One type of temperature sensor that may be included in an integrated circuit device is a ring-oscillator-based temperature sensor, which can easily be included in the circuitry of an integrated circuit device and consumes relatively little power. The output frequency of the ring-oscillator-based temperature sensor varies as a function of temperature of the integrated circuit device and can be converted to a temperature value as needed. However, the output frequency of a ring oscillator in an integrated circuit may be more sensitive to power supply voltage variations than to temperature, leading to inaccurate temperature readings. For example, in some known integrated circuit ring-oscillator-based temperature sensors, a 5% shift in the supply voltage may result in a 30° C. shift in the indicated temperature.

SUMMARY

Circuitry according to implementations of the subject matter of this disclosure, for determining temperature of an integrated circuit device, includes a ring oscillator on the integrated circuit device, a bias current generator on the integrated circuit device, the bias current generator being selectably operable in one of (i) a first mode in which the bias current generator has a first sensitivity to temperature of the integrated circuit device and (ii) a second mode in which the bias current generator has a second sensitivity to temperature of the integrated circuit device, the bias current generator providing bias current for the ring oscillator, and a controller configured to operate the bias current generator in the first mode in which the bias current generator has the first sensitivity to temperature of the integrated circuit device, record a frequency output of the ring oscillator while the bias current generator operates in the first mode, operate the bias current generator in the second mode in which the bias current generator has the second sensitivity to the temperature of the integrated circuit device, record a frequency output of the ring oscillator while the bias current generator operates in the second mode, and determine the temperature of the integrated circuit device from a ratio of (a) the frequency output of the ring oscillator while the bias current generator operates in the first mode to (b) the frequency output of the ring oscillator while the bias current generator operates in the second mode.

In a first implementation of such circuitry, the bias current generator may be more sensitive to the temperature of the integrated circuit device in the second mode than in the first mode.

In such an implementation, the bias current generator may output a constant current in the first mode, and the bias current generator may output a proportional-to-absolute-temperature current in the second mode.

In a second implementation of such circuitry, the controller may be configured to determine the temperature of the integrated circuit device from the ratio by dividing the ratio by a constant coefficient.

In a first variant of the second implementation, the controller may be configured to determine the temperature of the integrated circuit device from the ratio by dividing the ratio by the constant coefficient to yield a quotient, and subtracting an offset from the quotient.

In that first variant of the second implementation, the offset may be determined by physical characteristics of the circuitry.

In a second variant of the second implementation, the constant coefficient may be determined by physical characteristics of the circuitry.

A third implementation of such circuitry may further include circuitry configured to encode the frequency output of the ring oscillator for input to the controller.

A fourth implementation of such circuitry may further include a bias voltage generator including a first current source, and additional current sources in the ring oscillator, where the first current source and the additional current sources mirror the bias current generator.

A method according to implementations of the subject matter of this disclosure, for determining temperature of an integrated circuit device having a ring oscillator, and having a bias current generator, the bias current generator being selectably operable in one of (i) a first mode having a first sensitivity to temperature of the integrated circuit device and (ii) a second mode having a second sensitivity to temperature of the integrated circuit device, the bias current generator providing bias current for the ring oscillator, includes operating the bias current generator in the first mode in which the bias current generator has the first sensitivity to temperature of the integrated circuit device, recording a frequency output of the ring oscillator while the bias current generator operates in the first mode, operating the bias current generator in the second mode in which the bias current generator has the second sensitivity to the temperature of the integrated circuit device, recording a frequency output of the ring oscillator while the bias current generator operates in the second mode, and determining the temperature of the integrated circuit device from a ratio of (a) the frequency output of the ring oscillator while the bias current generator operates in the first mode to (b) the frequency output of the ring oscillator while the bias current generator operates in the second mode.

In a first implementation of such a method, when operating in the second mode, the bias current generator may be more sensitive to the temperature of the integrated circuit device than when operating in the first mode.

That first implementation may include outputting a constant current from the bias current generator in the first mode, and outputting a proportional-to-absolute-temperature current from the bias current generator in the second mode.

In a second implementation of such a method, the determining the temperature of the integrated circuit device from the ratio may include dividing the ratio by a constant coefficient.

In a first variant of that second implementation, the determining the temperature of the integrated circuit device from the ratio may include dividing the ratio by the constant coefficient to yield a quotient, and subtracting an offset from the quotient.

That first variant may include determining the offset from physical characteristics of the integrated circuit device.

A second variant of that second implementation may include determining the constant coefficient from physical characteristics of the integrated circuit device.

A third implementation of such a method may further include encoding the frequency output of the ring oscillator.

In a first variant of that third implementation, encoding the frequency output of the ring oscillator may include encoding the frequency output of the ring oscillator while operating the bias current generator in the first mode.

In that first variant, encoding the frequency output of the ring oscillator further may include encoding the frequency output of the ring oscillator while operating the bias current generator in the second mode.

A fourth implementation of such method may further include mirroring the bias current generator to current sources in the ring oscillator.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As described above, the output frequency of a ring oscillator in an integrated circuit may be more sensitive to power supply voltage variations than to temperature, leading to inaccurate temperature readings. However, in accordance with implementations of the subject matter of this disclosure, a ring-oscillator-based temperature sensor may be provided that is relatively insensitive to power supply voltage variations.

Specifically, a ring-oscillator-based temperature sensor in accordance with implementations of the subject matter of this disclosure includes a bias voltage generator based on a current generator that is operable in two modes with differing temperature sensitivities —a constant current mode, and a proportional-to-absolute-temperature current mode. By alternatingly operating the current generator in the two different modes, two different output frequencies may be obtained and the determination of temperature from the relationship of those two frequencies cancels out the contribution of, and therefore any variations in, the supply voltage.

Figure 1:
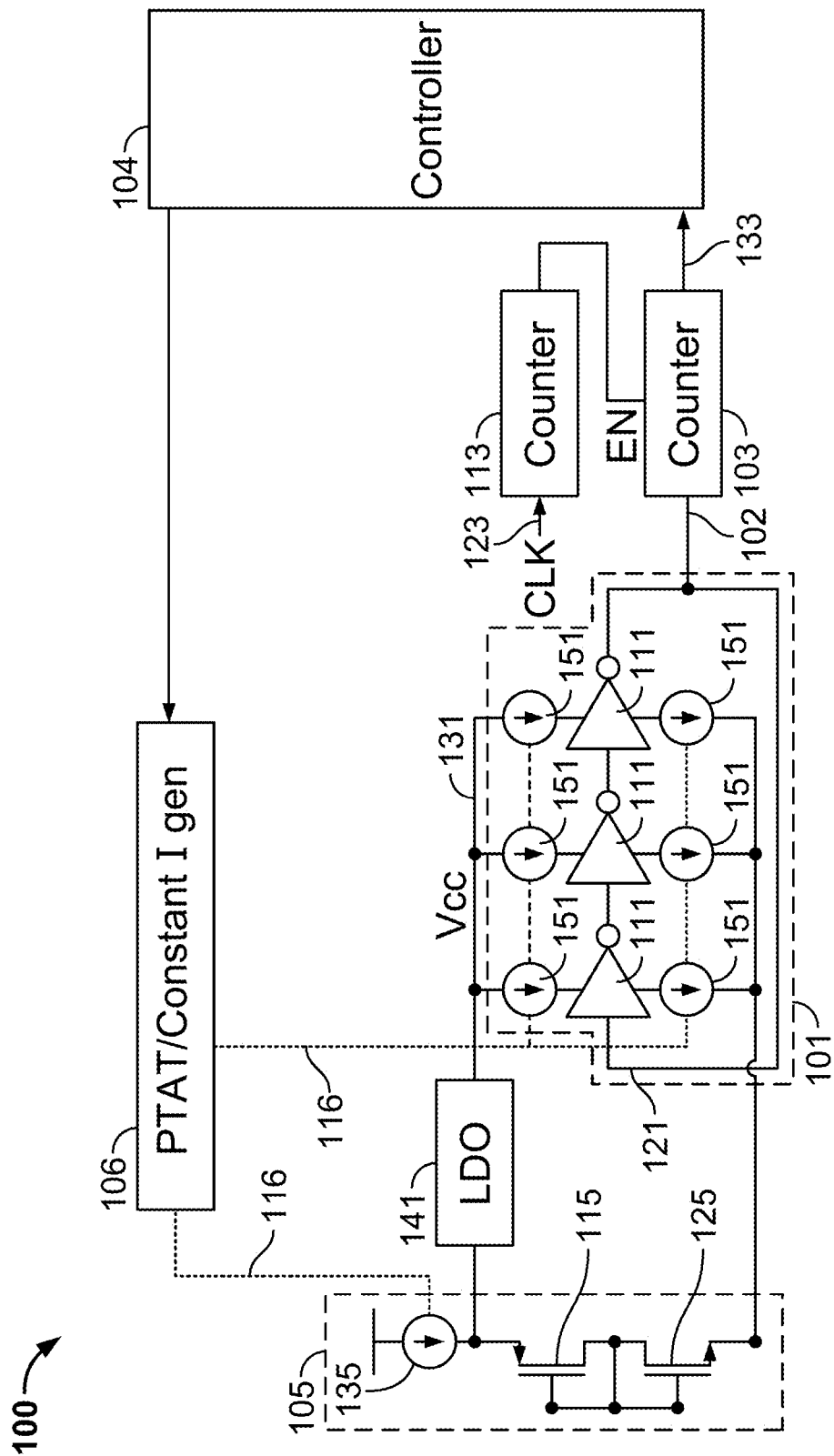
FIG. 1 is a schematic representation of a ring-oscillator-based temperature sensor according to implementations of the subject matter of the present disclosure.
Figure 2:
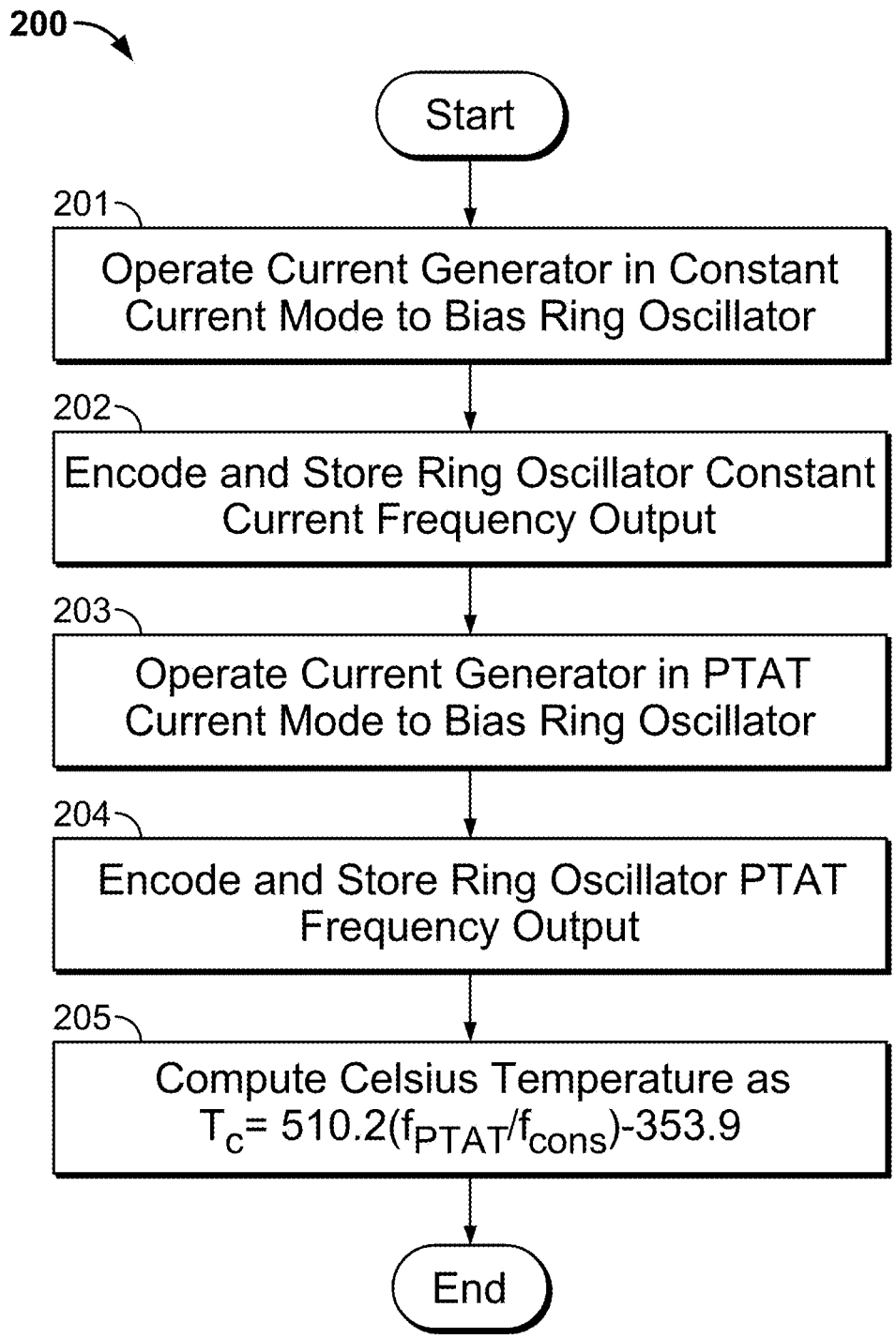
FIG. 2 is a flow diagram showing a method in accordance with implementations of the subject matter of this disclosure for determining temperature using a ring-oscillator-based temperature sensor.

The subject matter of this disclosure may be better understood by reference to FIGS. 1 and 2.

As seen in FIG. 1, a temperature sensor 100 in accordance with implementations of the subject matter of this disclosure includes a ring oscillator 101 including an odd number of series-connected inverters 111, whose output is fed back at 121 to its input. Although only three inverters 111 are shown for ease of illustration, the actual number of inverters 111 may be substantially greater. The resolution of the output frequency signal 102, and therefore the temperature derived from that signal, increases with the number of inverters 111.

In this implementation, the output frequency signal 102 is divided by a counter 103, which is in turn enabled based on the output of counter 113 which divides reference clock signal (CLK) 123 to determine a reference counting period. The resulting coded frequency signal 133 is input to controller 104. However, in other implementations, output frequency signal 102 may be input directly to controller 104, or may be encoded in some other way before being input to controller 104. Controller 104 determines the temperature as described below.

Oscillator supply voltage (Vcc) 131 is supplied, via low drop-out regulator 141, by bias voltage circuit 105, including a current source 135, and series-connected NMOS transistor 115 and PMOS transistor 125 in a gate-to-source configuration. In addition, each inverter 111 in ring oscillator 101 includes two current sources 151.

Current source 135 and each of current sources 151 mirrors, at 116 (using well-known mirroring techniques), a current supply from PTAT/Constant Current generator 106, which can operate in two modes. In a first mode, PTAT/Constant Current generator 106 supplies a constant current icons. In a second mode, PTAT/Constant Current generator 106 supplies a proportional-to-absolute-temperature (PTAT) current $I_{PTAT}$. The mode is selected by controller 104 as part of its operations to determine temperature from frequency signal 133.

Controller 104 causes PTAT/Constant Current generator 106 to alternate between constant-current mode and PTAT current mode. In one implementation, the period in which PTAT/Constant Current generator 106 operates in the constant-current mode has the same duration as the period in which PTAT/Constant Current generator 106 operates in the PTAT current mode. That duration may vary according to features of the particular implementation (such as the frequency of reference clock 123), but is generally on the order of microseconds. In the constant-current mode, frequency signal 133 has a frequency which may be denoted as $f_{cons}$, while in the PTAT current mode, frequency signal 133 has a frequency which may be denoted as $f_{PTAT}$.

Either frequency ($f_{cons}$ or $f_{PTAT}$) is proportional to the respective ratio of the current ($I_{cons}$ or $I_{PTAT}$ as the case may be) to the product of the supply voltage and the internal capacitance of ring oscillator 101:

$$f_{cons} = \eta_1 I_{cons}/CV$$

$$f_{PTAT} = \eta_2 I_{PTAT}/CV$$

where $\eta_1$ and $\eta_2$ are respective proportionality coefficients. Therefore, the ratio of the two frequencies, which is proportional to temperature, is independent of the supply voltage V:

$$f_{PTAT}/f_{cons} = \eta I_{PTAT}/I_{cons} = \alpha T$$

where T is measured in Kelvin, $\eta=\eta_2/\eta_1$, and $1/\alpha$ is an ideal proportionality coefficient based on physical constants and characteristics of the system.

In a real, non-ideal, implementation, because of the device operation point transition and other non-ideal factors, the measurable ring oscillator frequency may deviate from the ideal frequency by a small constant offset $f_{OS}$. If the measurable frequency in PTAT current mode is called $f'_{PTAT}$, and the measurable frequency in constant current mode is called $f'_{cons}$, then:

$$f'_{PTAT}=f_{PTAT}+f_{OS}$$

$$f'_{cons}=f_{cons}+f_{OS}.$$

$f_{OS}$ can be expressed as $kf_{cons}$, where k is a process dependent value that is typically a constant, because the supply voltage sensitivity of $f_{OS}$ and $f_{cons}$ cancels in the ratio.

As described above, $\alpha T=f_{PTAT}/f_{cons}$. Therefore:

$$\alpha T=(f'_{PTAT}-f_{OS})/(f'_{cons}-f_{OS})$$

$$=(f'_{PTAT}-kf'_{cons})/(f'_{cons}-kf'_{cons})$$

$$=((f'_{PTAT}/f'_{cons})-k)/(1-k)$$

$$=(D_T-k)/(1-k)$$

where $D_T$ is the ratio of the measurable frequency values $f'_{PTAT}/f'_{cons}$.

Solving for T:

$$T=(D_T/(\alpha(1-k)))-(k/(\alpha(1-k)))$$

Given a typical CMOS process as an example, a typical value for the coefficient $1/(\alpha(1-k))$ would be 510.2 and a typical value for the offset $k/(\alpha(1-k))$ would be 80.9. Thus, starting with the measured digitized frequency ratio $D_T$, the temperature T in Kelvin would be expected to be:

$$T=510.2D_T-80.9$$

and the temperature $T_c$ in Celsius would be expected to be:

$$T_c=T-273=510.2D_T-353.9.$$

A method 200 according to implementations of the subject matter of this disclosure for determining temperature of an integrated circuit device is diagrammed in FIG. 2. At 201, a current generator on the integrated circuit device is operated in a constant current mode to bias a ring oscillator. At 202, the frequency output by the ring oscillator in constant current mode ($f'_{cons}$) is encoded and stored (e.g., in memory in controller 104). At 203, the current generator on the integrated circuit device is operated in a PTAT current mode to bias the ring oscillator. At 204, the frequency output by the ring oscillator in PTAT current mode ($f'_{PTAT}$) is encoded and stored (e.g., in memory in controller 104).

At 205, the ratio $f'PTAT/f'_{cons}$ is taken (e.g., by controller 104). That ratio is then multiplied by 510.2, and offset by subtracting 353.9 (e.g., by controller 104), to yield the temperature in Celsius, and method 200 ends.

Thus it is seen that a ring-oscillator-based temperature sensor that is relatively insensitive to power supply voltage variations, and a corresponding method for determining temperature of an integrated circuit device, have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation. For example, with regard to FIG. 2, the current generator may first be operated in a PTAT current mode to bias a ring oscillator and then subsequently operated in a constant current mode to bias the ring oscillator. In such a case, the ratio of (i) the frequency output by the ring oscillator in constant current mode ($f'_{cons}$) and (ii) the frequency output by the ring oscillator in PTAT current mode ($f'_{PTAT}$) can be appropriately processed by the controller 104 to yield the temperature. The present invention is limited only by the claims which follow.

What is claimed is:

1. Circuitry for determining temperature of an integrated circuit device, the circuitry comprising:
   a ring oscillator on the integrated circuit device;
   a bias current generator on the integrated circuit device providing bias current for the ring oscillator, the bias current generator being selectably operable in one of (i) a first mode in which the bias current generator has a first sensitivity to temperature of the integrated circuit device and (ii) a second mode in which the bias current generator has a second sensitivity to temperature of the integrated circuit device, the bias current generator being more sensitive to the temperature of the integrated circuit device in the first mode than in the second mode; and
   a controller configured to:
      operate the bias current generator in the first mode in which the bias current generator has the first sensitivity to temperature of the integrated circuit device,
      record a frequency output of the ring oscillator while the bias current generator operates in the first mode,
      operate the bias current generator in the second mode in which the bias current generator has the second sensitivity to the temperature of the integrated circuit device,
      record a frequency output of the ring oscillator while the bias current generator operates in the second mode, and
      determine the temperature of the integrated circuit device from a ratio of (a) the frequency output of the ring oscillator while the bias current generator operates in the first mode to (b) the frequency output of the ring oscillator while the bias current generator operates in the second mode.

2. The circuitry of claim 1, wherein:
   the bias current generator outputs a proportional-to-absolute-temperature current in the first mode; and
   the bias current generator outputs a constant current in the second mode.

3. The circuitry of claim 1, wherein the controller is configured to determine the temperature of the integrated circuit device from the ratio by multiplying the ratio by a constant coefficient.

4. The circuitry of claim 3, wherein the controller is configured to determine the temperature of the integrated circuit device from the ratio by:
   multiplying the ratio by the constant coefficient to yield a product; and
   subtracting an offset from the product.

5. The circuitry of claim 4, wherein the offset is determined by physical characteristics of the circuitry.

6. The circuitry of claim 3, wherein the constant coefficient is determined by physical characteristics of the circuitry.

7. The circuitry of claim 1, further comprising circuitry configured to encode the frequency output of the ring oscillator for input to the controller.

8. The circuitry of claim 1, further comprising:
a bias voltage generator comprising a first current source; and
additional current sources in the ring oscillator; wherein:
the first current source and the additional current sources mirror the bias current generator.

9. A method for determining temperature of an integrated circuit device having a ring oscillator, and having a bias current generator, the bias current generator being selectably operable in one of (i) a first mode having a first sensitivity to temperature of the integrated circuit device and (ii) a second mode having a second sensitivity to temperature of the integrated circuit device, the bias current generator providing bias current for the ring oscillator, the method comprising:
operating the bias current generator in the first mode in which the bias current generator has the first sensitivity to temperature of the integrated circuit device and in which the bias current generator is more sensitive to the temperature of the integrated circuit device than when operating in the second mode;
recording a frequency output of the ring oscillator while the bias current generator operates in the first mode;
operating the bias current generator in the second mode in which the bias current generator has the second sensitivity to the temperature of the integrated circuit device;
recording a frequency output of the ring oscillator while the bias current generator operates in the second mode; and
determining the temperature of the integrated circuit device from a ratio of (a) the frequency output of the ring oscillator while the bias current generator operates in the first mode to (b) the frequency output of the ring oscillator while the bias current generator operates in the second mode.

10. The method of claim 9, comprising:
outputting a proportional-to-absolute-temperature current from the bias current generator in the first mode; and
outputting a constant current from the bias current generator in the second mode.

11. The method of claim 9, wherein the determining the temperature of the integrated circuit device from the ratio comprises multiplying the ratio by a constant coefficient.

12. The method of claim 11, wherein the determining the temperature of the integrated circuit device from the ratio comprises:
multiplying the ratio by the constant coefficient to yield a product; and
subtracting an offset from the product.

13. The method of claim 12, comprising determining the offset from physical characteristics of the integrated circuit device.

14. The method of claim 11, comprising determining the constant coefficient from physical characteristics of the integrated circuit device.

15. The method of claim 9, further comprising encoding the frequency output of the ring oscillator.

16. The method of claim 15, wherein encoding the frequency output of the ring oscillator comprises encoding the frequency output of the ring oscillator while operating the bias current generator in the first mode.

17. The method of claim 16, wherein encoding the frequency output of the ring oscillator further comprises encoding the frequency output of the ring oscillator while operating the bias current generator in the second mode.

18. The method of claim 9, further comprising mirroring the bias current generator to current sources in the ring oscillator.

* * * * *